(12) United States Patent
Yang

(10) Patent No.: US 8,873,229 B2
(45) Date of Patent: Oct. 28, 2014

(54) ELECTRONIC DEVICE HAVING CARD HOLDER

(71) Applicants: Fu Tai Hua Industry (Shenzhen) Co., Ltd., Shenzhen (CN); Hon Hai Precision Industry Co., Ltd., New Taipei (TW)

(72) Inventor: Li-Jun Yang, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/717,732

(22) Filed: Dec. 18, 2012

(65) Prior Publication Data
US 2014/0092534 A1   Apr. 3, 2014

(30) Foreign Application Priority Data
Sep. 29, 2012   (CN) .......................... 2012 1 0370063.7

(51) Int. Cl.
G06F 1/16 (2006.01)
H05K 5/00 (2006.01)
H05K 7/00 (2006.01)
H05K 5/02 (2006.01)

(52) U.S. Cl.
CPC .................................. *H05K 5/0217* (2013.01)
USPC ................................ 361/679.31; 361/679.32

(58) Field of Classification Search
CPC combination set(s) only.
See application file for complete search history.

(56) References Cited

U.S. PATENT DOCUMENTS

| | | | |
|---|---|---|---|
| 5,692,208 A * | 11/1997 | Felcman et al. | 361/679.38 |
| 7,009,836 B2 * | 3/2006 | Lo | 361/679.55 |
| 7,265,987 B2 * | 9/2007 | Zhang et al. | 361/727 |
| 7,430,115 B2 * | 9/2008 | Liu et al. | 361/679.33 |
| 7,681,210 B2 * | 3/2010 | Jiang et al. | 720/638 |
| 7,929,289 B2 * | 4/2011 | Tseng | 361/679.39 |
| 2006/0291159 A1 * | 12/2006 | Jiang et al. | 361/685 |
| 2008/0101004 A1 * | 5/2008 | Chen | 361/684 |
| 2010/0172085 A1 * | 7/2010 | Lee | 361/679.33 |

\* cited by examiner

*Primary Examiner* — Hoa C Nguyen
*Assistant Examiner* — Xanthia C Cunningham
(74) *Attorney, Agent, or Firm* — Novak Druce Connolly Bove + Quigg LLP

(57) ABSTRACT

An electronic device includes a housing, a card holder, and a card holder mechanism. A sidewall of the housing defines a slot. A projection protrudes from the card holder. The card holder control mechanism includes a knob and a rotatable plate. The knob includes an operation portion and a connecting portion. The operation portion is external to the housing for operation, and the connecting portion is received in the housing and secured to the rotatable plate. When the knob is rotated from a first orientation to a second orientation, the rotatable plate is driven to rotate by the rotation of the knob. During the rotation of the rotatable plate, the rotatable plate resists the projection of the card holder to drive the card holder to move toward the slot until a portion of the card holder extends the housing.

9 Claims, 6 Drawing Sheets

ELECTRONIC DEVICE HAVING CARD HOLDER

BACKGROUND

1. Technical Field

The present disclosure relates to electronic devices and, particularly, to an electronic device providing card holder access of the electronic device.

2. Description of Related Art

To access a mobile phone smart card, a cover and a battery must often first be removed, or at least a cover must be removed. Therefore, what is needed is an electronic device which provides better access to the smart card.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
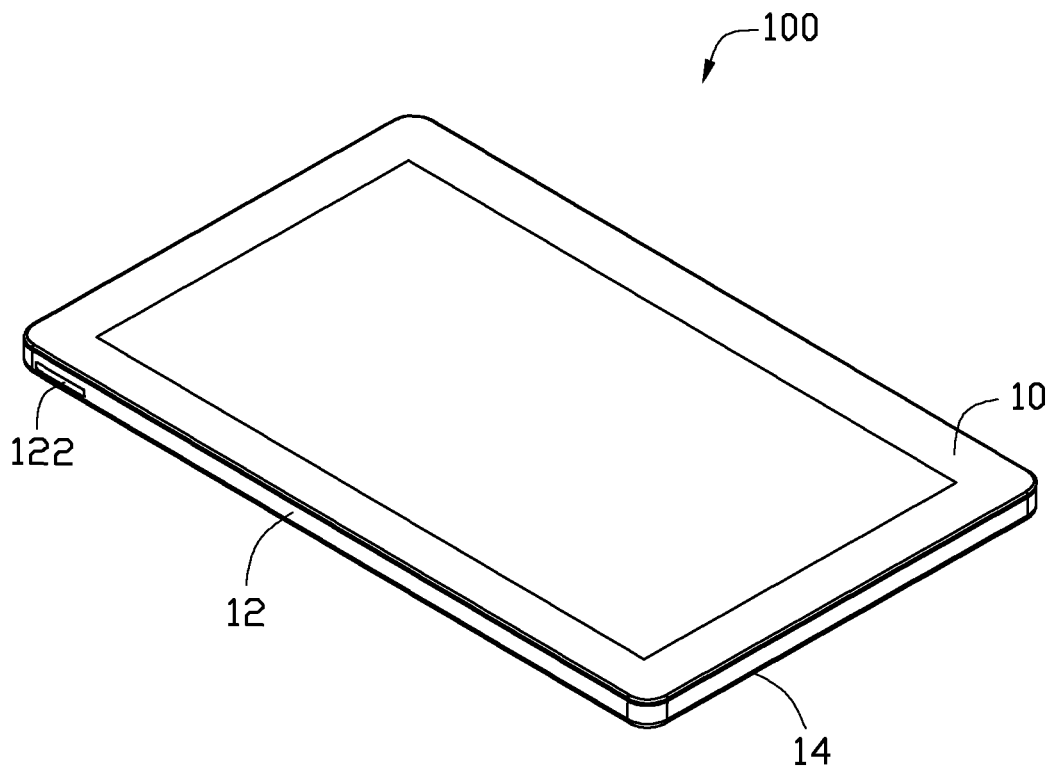
FIG. 1 is an isometric view of an embodiment of an electronic device providing card holder access.
Figure 2:
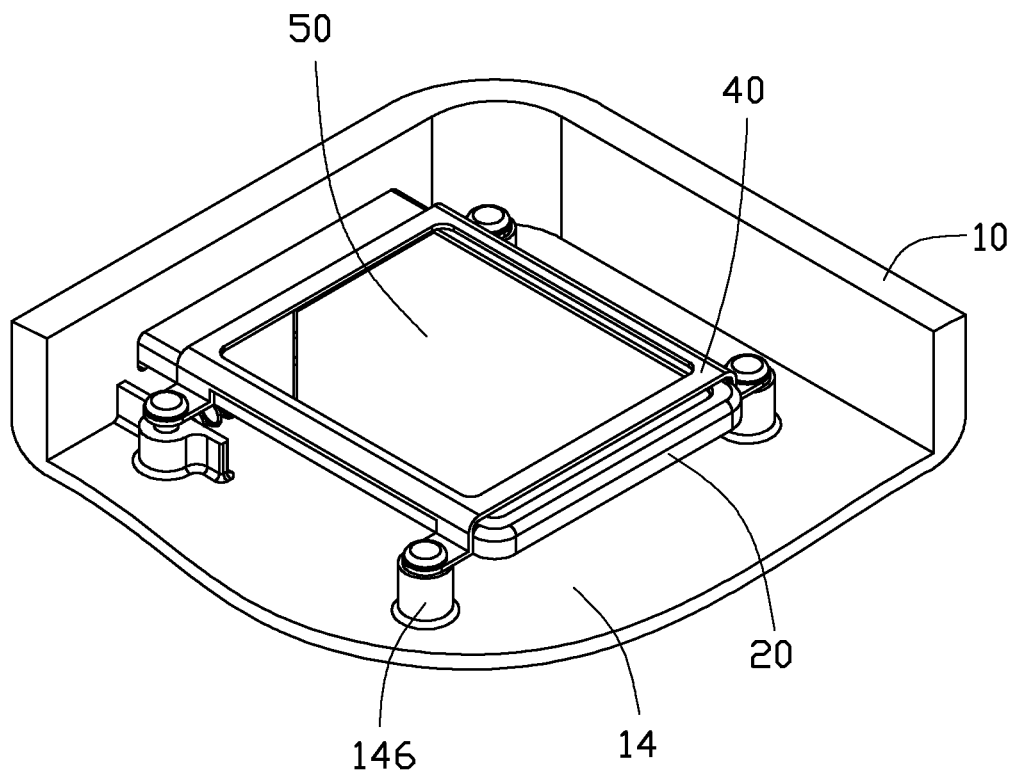
FIG. 2 is a partially isometric view of the electronic device of FIG. 1.

FIG. 1 and FIG. 2 illustrate an embodiment of an electronic device 100 providing card holder access. The electronic device 100 includes a housing 10, a card holder 20, a card holder control mechanism 30 (see FIG. 3), and a card holder retaining element 40. The card holder 20 is to receive an electronic card 50, such as a smart card, a memory card, or other. When the electronic card 50 is retained within the housing 10, the electronic card 50 is connected to a connector (not shown) of the electronic device 100, thus the electronic card 50 is secured to the housing 10 and is electronically connected to a circuit board (not shown) of the electronic device 100 via the connector.

Figure 3:
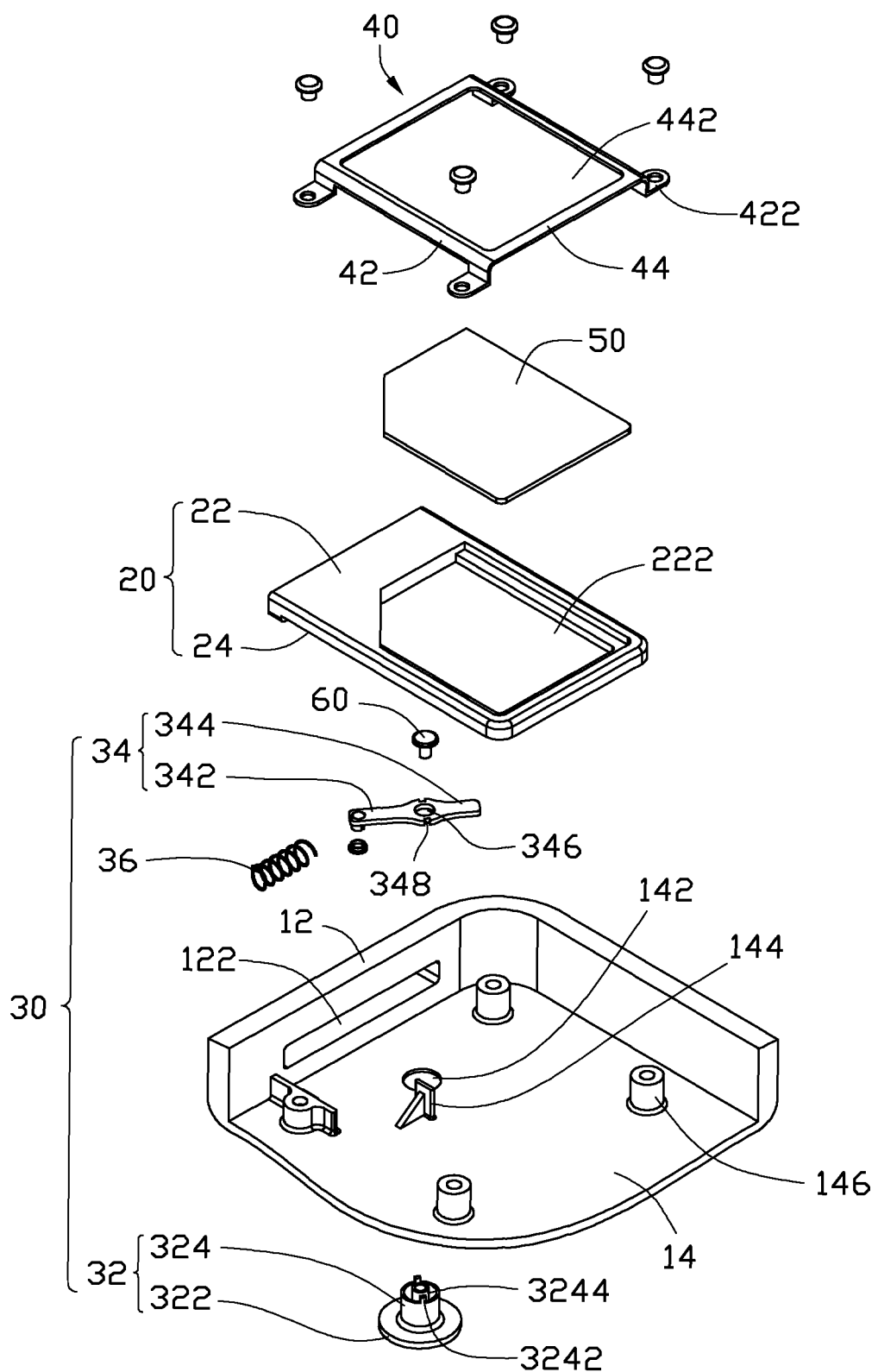
FIG. 3 is an exploded, perspective view of the electronic device of FIG. 2.
Figure 4:
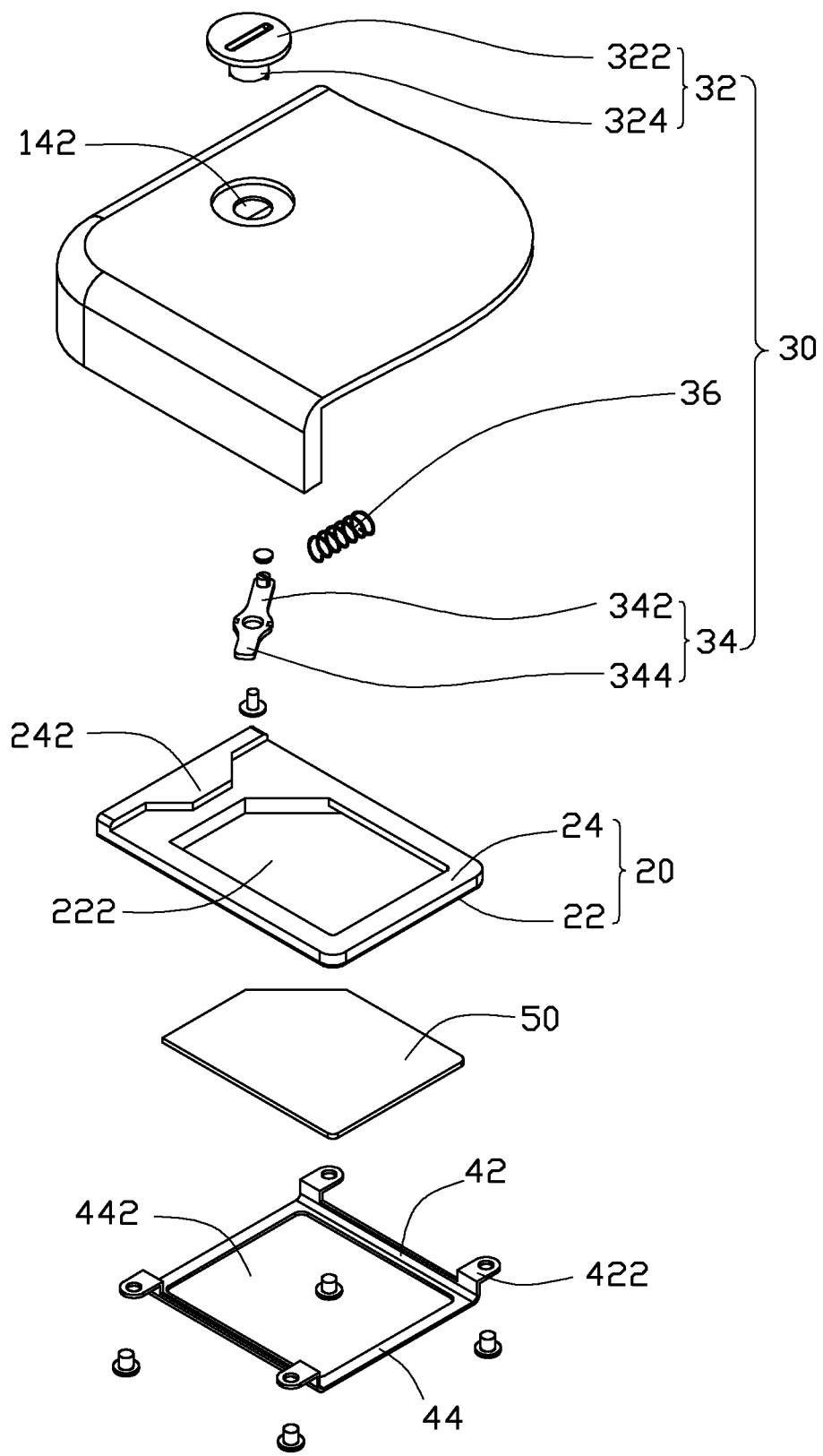
FIG. 4 is similar to FIG. 3, but viewed from another viewpoint.

Referring also to FIG. 3 and FIG. 4, the housing 10 includes a sidewall 12 and a bottom 14. The sidewall 12 defines a slot 122 extending along a longitudinal side of the housing 12. The card holder 20 is driven to extend out of the housing 10 through the slot 122. The bottom 14 defines a through hole 142. In this embodiment, the through hole 142 is a stepped hole and includes a narrower hole portion defined in an inner portion of the bottom 14 and a wider hole portion defined in an outer portion of the bottom 14. The card holder 20 includes a top surface 22 and a bottom surface 24 opposite to the top surface 22. The top surface 22 defines a recessed receiving space 222 to receive the electronic card 50. A projection 242 protrudes from the bottom surface 24. The mechanism 30 includes a knob 32, a rotatable plate 34, and an elastic element 36. The knob 32 includes an operation portion 322 and a connecting portion 324 substantially perpendicular to the operation portion 322. The diameter of the connecting portion 324 is less than the diameter of the operation portion 322, and is substantially equal to the diameter of the narrower hole portion of the through hole 142. The diameter of the operation portion 322 is substantially equal to the diameter of the wider hole portion of the through hole 142. The connecting portion 324 passes through the narrower hole portion of the through hole 142 and is secured to an intermediate portion of the rotatable plate 34. The operation portion 322 is received in the wider hole portion of the through hole 142 for operation. One end of the elastic element 36 is secured to the rotatable plate 34, and an opposite end of the elastic element 36 is secured to the bottom 14 of the housing 10.

Figure 5:
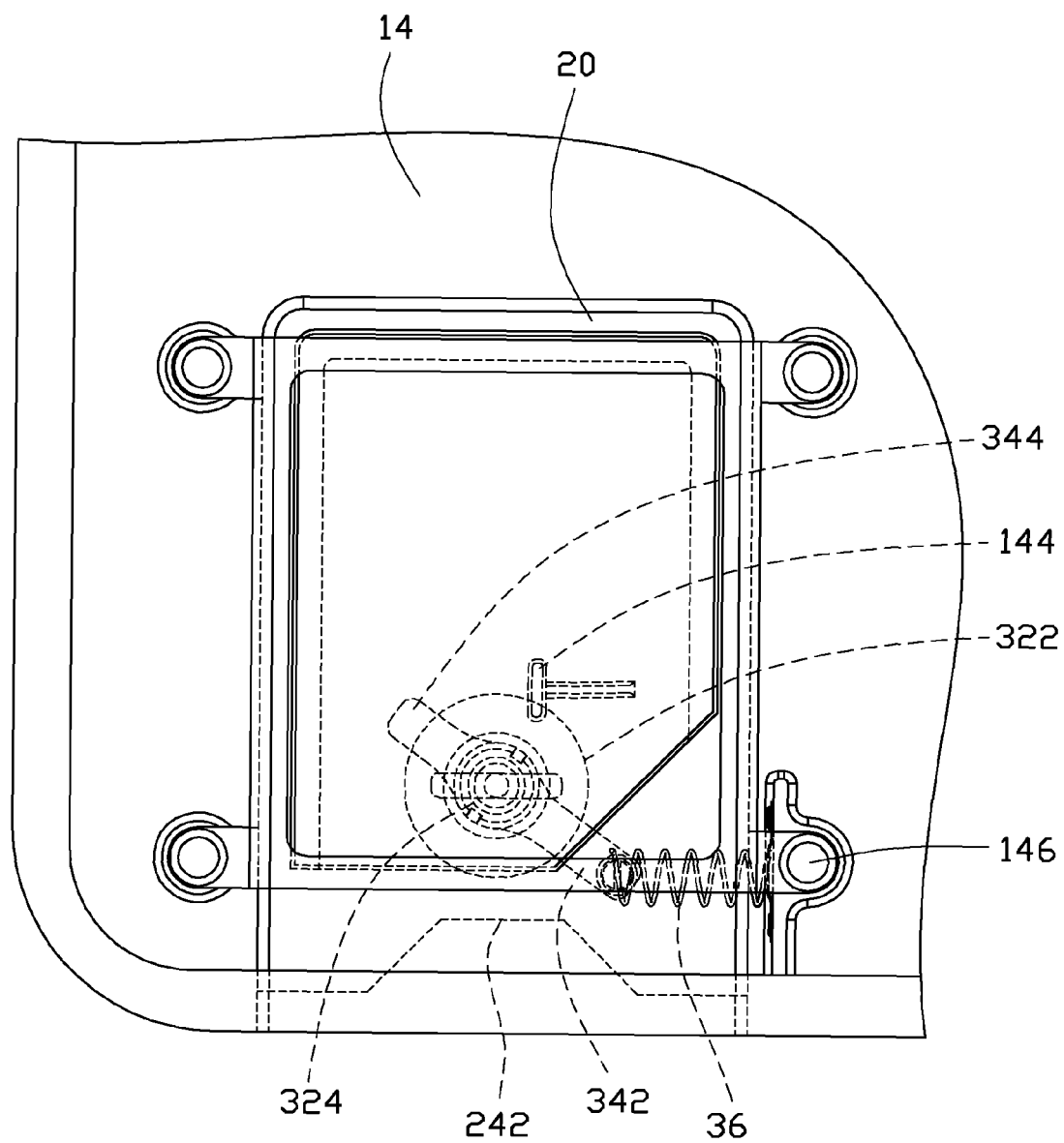
FIG. 5 is a planform of the electronic device of FIG. 2, showing a card holder received in the electronic device of FIG. 2.
Figure 6:
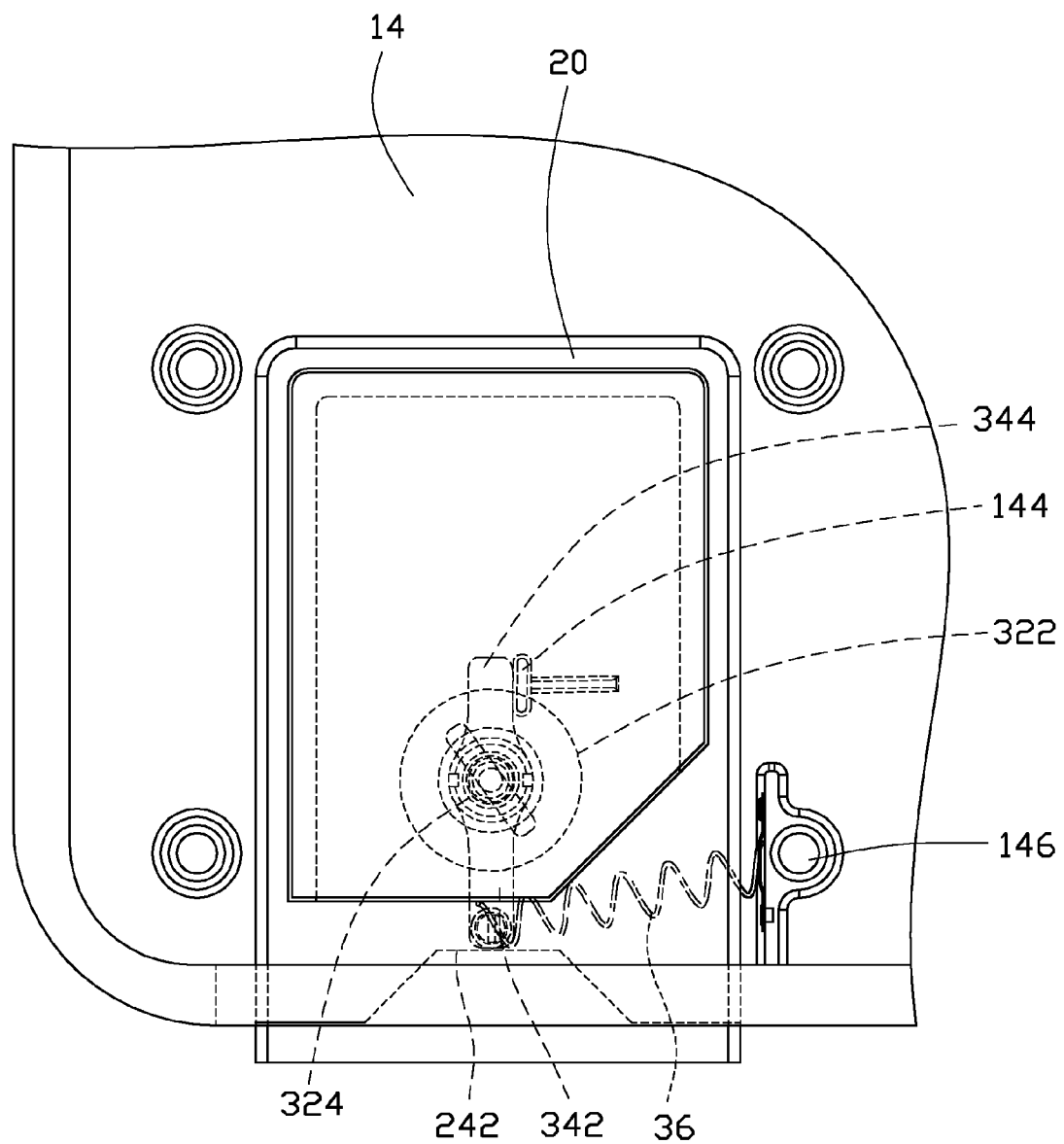
FIG. 6 is another planform of the electronic device of FIG. 2, showing the card holder partially extending from the electronic device of FIG. 2.

Referring also to FIG. 5 and FIG. 6, the knob 32 can be rotated between a first orientation and a second orientation. When the knob 32 is rotated from the first orientation to the second orientation, the rotation drives the rotatable plate 34 to rotate from a first position to a second position. When the rotatable plate 34 is rotated from the first position to the second position, the rotatable plate 34 resists the projection 342 and pushes the card holder 20 to move toward the slot 122 until a portion of the card holder 20 extends out of the housing 12 through the slot 122. At this point, the card holder 20 can be easily pulled out of the housing 10. When the rotatable plate 34 is in the first position, the elastic element 36 is in a natural state. When the rotatable plate 34 is rotated from the first position to the second position, the elastic element 36 is stretched. When the external force exerted on the knob 32 disappears, the elastic element 36 rebounds to respectively drive the rotatable plate 34 and the knob 32 to return to the first position and the first orientation.

In this embodiment, the rotatable plate 34 includes a resisting portion 342 and a free portion 344. A distal end of the resisting portion 342 is connected to the elastic element 36. When the knob 32 is rotated from the first orientation to the second orientation, the resisting portion 342 resists the projection 242 and pushes the card holder 20 to move toward the slot 122. The rotatable plate 34 defines a fixing hole 346 and a pair of latching slots 348 arranged in the intermediate position of the rotatable plate 34. The fixing hole 346 is arranged between the latching slots 348. In this embodiment, the connecting portion 324 is a hollow cylinder. A pair of hooks 3242 protrudes from a distal end of the connecting portion 324. A hollow post 3244 protrudes from a bottom of the connecting portion 324 and extends out of the connecting portion 324. The diameter of the post 3244 is substantially equal to the diameter of the fixing hole 346. To secure the rotatable plate 34 to the knob 32, the rotatable plate 34 is placed on the connecting portion 324, the post 3244 passes through the fixing hole 346, and each hook 3242 is placed in one latching slot 348. A screw 60 is then placed in the fixing hole 346 and the post 3244 sequentially to secure the rotatable plate 34 to the knob 32.

In this embodiment, a limiting block 144 protrudes from the bottom 14 of the housing 10 and is adjacent to the through hole 142. When the free portion of the rotatable plate 34 is rotated to resist the limiting block 144, the knob 32 is in the second orientation.

In this embodiment, four fixing posts 146 protrude from the bottom 14 of the housing 10. The four fixing posts 146 cooperatively form a rectangular. The slot 122 is arranged between two fixing posts 146 adjacent to the sidewall 12 of the housing 10. One end of the elastic element 36 is connected to the fixing post 146 adjacent to the slot 122. The retaining element 40 includes two opposite sidewalls 42 and a top surface 44. The top surface 44 defines a receiving cavity 442 extending through the limiting element 40. A pair of positioning tabs 422 protrudes from a bottom of the sidewall 42 and extends along a direction substantially perpendicular to the sidewall 42. The cooperation of the four positioning tabs 422 and four fixing posts 146 secures the limiting element 40 to the bottom 14 of the housing 10. The card holder 20 is arranged below the receiving cavity 442. The distance between the sidewalls 42 is substantially equal to the width of the card holder 20. Thus, the card holder 20 can be resisted by the rotatable plate 34 to stably move toward the slot 142.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. An electronic device providing card holder access, comprising:
   a housing comprising a sidewall and a bottom, the sidewall defining a slot, and the bottom defining a through hole;
   a card holder comprising a top surface and a bottom surface opposite to the top surface, the top surface defining a recessed receiving space to receive an electronic card, a projection protruding from the bottom surface; and
   a card holder control mechanism comprising a knob, an elongated rotatable plate, and an elastic element, the knob comprising an operation portion and a connecting portion, the operation portion being external to the housing, the connecting portion extending through the through hole and secured to an intermediate portion of the rotatable plate, one end of the elastic element being connected to the rotatable plate, and an opposite end of the elastic element being connected to the bottom of the housing, the knob configured for being manually operated to rotate between a first orientation and a second orientation, the rotatable plate jointly rotatable with the rotation of the knob between a first position where the knob is in the first orientation, the elastic element is in an original natural state, the rotatable plate is spaced apart from the projection, and the card holder is entirely received within the housing, and a second position where the knob is in the second orientation, the elastic element is stretched, and the rotatable plate resists the projection and pushes the card holder to move toward the slot until a portion of the card holder extends out of the housing through the slot, a resilient elastic force provided from the stretched elastic element drives the rotatable plate and the knob to respectively return to the first position and the first orientation if an external force exerted on the knob disappears.

2. The electronic device as described in claim 1, wherein the rotatable plate comprises a resisting portion and a free portion, a distal end of the resisting portion is connected to the elastic element, when the knob is rotated from the first orientation to the second orientation, the resisting portion resists the projection and push the card holder to move towards the slot.

3. The electronic device as described in claim 2, wherein a limiting block protrudes from the bottom of the housing and is adjacent to the through hole, when the knob is rotated to the second orientation, the free portion resists the limiting block.

4. The electronic device as described in claim 2, wherein a pair of hooks protrudes from a distal end of the connecting portion, the rotatable plate defines a pair of latching slots in the intermediate portion for engagement with the hooks, the engagement of the hooks with the latching slots connects the connecting portion of the knob to the rotatable plate.

5. The electronic device as described in claim 1, wherein a plurality of positioning posts protrudes from the bottom of the housing, the electronic device further comprises a card holder retaining element secured to the positioning posts, the card holder is arranged between the card holder retaining element and the card holder control mechanism, the card holder retaining element comprises two opposite sidewalls, the distance between the two opposite sidewalls of the card holder retaining element is substantially equal to the width of the card holder.

6. The electronic device as described in claim 5, wherein the slot is arranged between two of the positioning posts adjacent to the sidewall of the housing.

7. The electronic device as described in claim 5, wherein the card holder retaining element further comprises a plurality of positioning tabs extending along directions perpendicular to the opposite sidewalls of the card holder retaining element, each of the plurality of the positioning tabs is secured to the corresponding positioning post.

8. The electronic device as described in claim 5, wherein the opposite end of the elastic element is connected to one of the positioning posts adjacent to the slot.

9. The electronic device as describe in claim 1, wherein the through hole is a stepped hole and comprises a narrower hole portion and a wider hole portion, the narrower hole portion of the through hole is defined in an inner portion of the bottom, and the wider hole portion of the through hole is defined in an outer portion of the bottom, the diameter of the connecting portion of the knob is less than the diameter of the operation portion of the knob, and is equal to the diameter of the narrower hole portion of the through hole, and the diameter of the operation portion of the knob is equal to the diameter of the wider hole portion of the through hole.

* * * * *